United States Patent [19]

Sharpe-Geisler

[11] Patent Number: 4,740,485

[45] Date of Patent: Apr. 26, 1988

[54] METHOD FOR FORMING A FUSE

[75] Inventor: Bradley A. Sharpe-Geisler, San Jose, Calif.

[73] Assignee: Monolithic Memories, Inc., Santa Clara, Calif.

[21] Appl. No.: 888,559

[22] Filed: Jul. 22, 1986

[51] Int. Cl.$^4$ .................. H01L 23/52; H01L 21/82; H01H 85/10

[52] U.S. Cl. .................... 437/246; 437/245; 437/228; 437/60; 437/922; 156/644; 156/652; 357/71

[58] Field of Search .............. 29/577 C, 591, 623; 156/644, 652, 656, 661.1; 357/68, 51, 67, 71; 148/DIG. 55, 51; 437/245, 246, 922, 60

[56] References Cited

U.S. PATENT DOCUMENTS

| | | | |
|---|---|---|---|
| 3,619,725 | 11/1971 | Mendham | 317/101 A |
| 4,032,949 | 6/1977 | Bierig | 357/51 |
| 4,135,295 | 1/1979 | Price | 29/623 |
| 4,184,933 | 1/1980 | Morcom et al. | 204/192 EC |
| 4,192,016 | 3/1980 | Taylor | 365/163 |
| 4,203,800 | 5/1980 | Kitcher et al. | 156/643 |
| 4,209,894 | 7/1980 | Keen | 29/577 R |
| 4,272,753 | 6/1981 | Nicolay | 337/297 |
| 4,381,215 | 4/1983 | Reynolds et al. | 156/643 |
| 4,396,900 | 8/1983 | Hall | 338/309 |
| 4,413,272 | 11/1983 | Mochizuki et al. | 357/65 |
| 4,417,387 | 11/1983 | Heslop | 29/591 |
| 4,436,582 | 3/1984 | Saxena | 156/656 |
| 4,439,269 | 3/1984 | Cukauskas | 156/643 |
| 4,451,326 | 5/1984 | Gwozdz | 156/643 |
| 4,470,873 | 9/1984 | Nakamura | 156/640 |
| 4,556,897 | 12/1985 | Yorikane et al. | 357/51 |

FOREIGN PATENT DOCUMENTS

| | | | |
|---|---|---|---|
| 0163859 | 9/1984 | Japan | 156/652 |
| 0084837 | 5/1985 | Japan | 148/DIG. 55 |
| 00854835 | 5/1985 | Japan | 148/DIG. 55 |
| 0128640 | 7/1985 | Japan | 148/DIG. 55 |
| 0154640 | 8/1985 | Japan | 148/DIG. 55 |

Primary Examiner—Brian E. Hearn
Assistant Examiner—William Bunch
Attorney, Agent, or Firm—Kenneth E. Leeds; Alan H. MacPherson; Paul J. Winters

[57] ABSTRACT

A method for forming a titanium tungsten fuse begins with the steps of forming a silicon dioxide layer (42), a titanium tungsten layer (44) and an aluminum layer (46) on a silicon substrate (40). The titanium tungsten layer serves as fuse material while the aluminum layer serves as interconnect material. A photolithographic mask (48) is then applied to the wafer. The portion of the aluminum layer exposed by the photolithographic mask and the portion of the titanium tungsten layer lying thereunder are then removed. Because both the aluminum and titanium tungsten layers are etched simultaneously, a dry etching process can be used during this step. The resulting structure includes a thin aluminum and titanium tungsten region where the resulting fuse is to be formed. Thereafter, the first photolithographic mask is removed and a second photolithographic mask is applied to the wafer which includes a window region where the titanium tungsten fuse is to be formed. The portion of the aluminum layer within this window region is then removed, thereby leaving a narrow titanium tungsten fuse between two metal regions.

6 Claims, 4 Drawing Sheets

METHOD FOR FORMING A FUSE

BACKGROUND OF THE INVENTION

This invention relates to fuses and more specifically to methods for forming titanium tungsten fuses.

Programmable read only memories (PROMs) including titanium tungsten fuses are well known in the art. Typical prior art PROMs include an array of fuses. Each bit of data stored in the PROM is indicated by whether an associated fuse in the array is open or closed. Such PROMs are typically programmed by passing a current through selected fuses sufficient to melt portions of the titanium tungsten, thereby opening the fuse.

Titanium tungsten fuses are also used in programmable logic arrays (PLAs) to determine which of a number of logic functions is to be performed by the PLA. Such PLAs are described in "LSI Databook", 6th edition, published by Monolithic Memories, Inc., in 1985, incorporated herein by reference.

A typical prior art method for forming a titanium tungsten fuse is illustrated in FIGS. 1a through 1d. Referring to FIG. 1a, a silicon substrate 10 is covered with a silicon dioxide layer 12, a titanium tungsten layer 14, and an aluminum layer 16. Typically, semiconductor devices such as transistors, diodes and resistors (not shown) are formed in silicon substrate 10. Silicon dioxide layer 12 serves to insulate substrate 10 from titanium tungsten layer 14. Titanium tungsten layer 14 serves as a to-be-formed fuse and aluminum layer 16 serves as electrical interconnect material.

A photoresist layer 18 is then formed on aluminum layer 16. Photoresist layer 18 is then patterned, thereby exposing portions of aluminum layer 16. The exposed portions of aluminum layer 16 are then etched away, thereby exposing portions of titanium tungsten layer 14. Of importance, the etchant selected to etch aluminum layer 16 etches aluminum without etching the underlying portion of titanium tungsten layer 14. Typically, an etchant such as a mixture of acetic, phosphoric, and nitric acids is used during this step.

Thereafter, photoresist layer 18 is removed and the wafer is covered with a second photoresist layer 20 (FIG. 1b). Second photoresist layer 20 is patterned in a conventional manner, thereby exposing portions of titanium tungsten layer 14. The exposed portions of titanium tungsten layer 14 are then removed using a wet chemical etchant such as hydrogen peroxide ($H_2O_2$). Thereafter, photoresist layer 20 is removed, thereby leaving the structure of FIG. 1c. FIG. 1d illustrates in plan view the structure of FIG. 1c.

As can be seen, the structure of FIGS. 1c and 1d includes metal 16 formed on titanium tungsten layer 14. A portion 14a of titanium tungsten layer 14 extends out from underneath aluminum layer 16. A narrow section 14b (typically about 1.5 microns wide) of portion 14a of titanium tungsten layer 14 serves as the fuse, which is opened when a current of about 15 to 30 mA is passed through it, depending on fuse dimensions.

In the plan view of FIG. 1d, aluminum layer 16 includes an aluminum interconnect 16a and aluminum pad 16b. Aluminum pad 16b typically electrically contacts the underlying semiconductor material via an opening in silicon dioxide layer 12 (not shown), while interconnect 16a electrically contacts other portions of integrated circuit.

Although the above-described prior art process provides adequate fuses, I have discovered that this process can be significantly improved as described below.

SUMMARY

A process for forming a fuse in an integrated circuit in accordance with the present invention begins with step of forming an insulating layer on a semiconductor substrate. Thereafter, a layer of fuse material (such as titanium tungsten) is formed on the insulating layer and a conductive layer (typically a metal such as aluminum) is formed on the fuse material. A first photolithographic mask is then formed on the aluminum layer. The pattern in the photolithographic mask is then transferred to both the aluminum layer and the fuse material using a dry etching process. The insulating layer serves as an etch stop during this etching process. Because both the aluminum layer and the fuse material are patterned during this process, a nonselective etching process such as a dry etching process can be used.

Thereafter, the first photolithographic mask is removed and a second photolithographic mask is applied to the wafer. The second photolithographic mask includes a window region defining a portion of the fuse material where the actual fuse is to be formed. The portion of the aluminum layer within this window region is removed, thereby leaving a narrow region of fuse material which serves as the actual fuse.

In one embodiment, metal interconnects are formed on the integrated circuit concurrently with the fuse. In such an embodiment, the first photolithographic mask defines the metal interconnects as well as the fuse. After the dry etching process, a patterned fuse material layer and a similarly patterned aluminum layer remain on the wafer which electrically interconnect various devices formed in the substrate.

The process in accordance with my invention provides several advantages not found in the prior art. For example, the dry etching process used in the present invention to form fuses and metal interconnects simultaneously can be controlled with greater precision than wet etching processes since dry etching processes cause less undercut. Because of this, resulting metal interconnects can be placed closer to each other than in the above-described prior art. Because the metal interconnects formed using the process of the present invention can be spaced more closely than interconnects formed using the prior art process described above, an integrated circuit using the present process can be formed on a smaller surface area, and is therefore less expensive to manufacture.

Process control in the present invention is further enhanced because dry etching eliminates the problems of photoresist lifting which typically accompanies wet etching processes. Process control is also enhanced because the photoresist mask which defines the shape of the actual fuse is formed on a planar surface. In other words, since the above-mentioned first photolithographic mask defines the shape of the fuse, and since the surface of the wafer near the to-be-formed fuse is substantially flat when the first photolithographic mask is formed, it is easier to precisely define fuses with the present process than the prior art process.

It should also be noted that the process of the present invention is less susceptible to problems caused by foreign particles such as dust. Such particles are known to cast shadows on photoresist during photolithographic patterning. If positive resist is used during patterning, these shadows can cause metal traces to be shorted together by the aluminum layer if foreign particles are present when patterning the first photoresist layer. Metal traces can also be shorted together by the fuse material if foreign particles are present when patterning the second photoresist layer. Because the mask used when patterning the second photoresist layer in my process is mostly opaque, dust particles present during patterning of the second photoresist layer are much less likely to cause a shorting problem than in the prior art process. (Although one could use negative resist in the prior art process to overcome this particular problem, the resolution which can be achieved with negative resist is less than the resolution which can be achieved with positive resist.)

It should be noted that during the above-mentioned prior art manufacturing process, it is necessary to measure a first critical dimension (i.e. the width of interconnect 16a) after applying photolithographic mask 18 and after etching aluminum layer 16, and a second critical dimension (i.e. the width of portion 14a of titanium tungsten layer 14) after applying photoresist layer 20 and after etching titanium tungsten layer 14. In the present invention, because the metal interconnects and the fuse are formed simultaneously, it is only necessary to measure one of these two critical dimensions to be assured that both are proper.

These and other advantages of the present invention will be appreciated in light of the detailed description below.

DETAILED DESCRIPTION

Figure 1A:
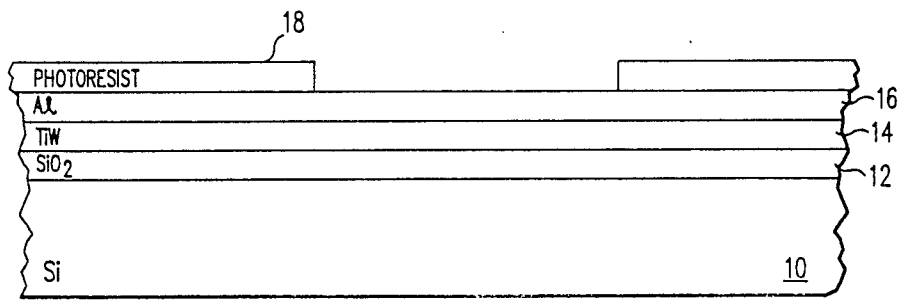
FIGS. 1a to 1d illustrate a fuse during a manufacturing process in accordance with the prior art.

FIGS. 2a to 2e illustrate in cross section a fuse in an integrated circuit during a manufacturing process in accordance with one embodiment of my invention. During this process, traces for electrically connecting semiconductor devices in the integrated circuit are also formed. (It will be understood by those skilled in the art that the structure of FIGS. 2a to 2e is a part of a wafer which includes a number of other structures similar to the structure of FIGS. 2a to 2e) Referring to FIG. 2a, a semiconductor substrate 40 is covered with an insulating layer 42. Typically, semiconductor devices such as diodes, transistors and resistors (not shown) are formed in substrate 40.

In one embodiment, substrate 40 is a silicon substrate, and insulating layer 42 is a 3200 Å thick silicon dioxide layer formed by a conventional thermal oxidation process. Window regions 43 are etched in insulating layer 42 using conventional techniques in order to permit electrical connection to devices formed in underlying substrate 40. In one embodiment a platinum layer (not shown) is sputtered onto the wafer and the wafer is heated, thereby forming platinum silicide at window regions 43. The unreacted platinum is then removed with aqua regia (HCl-HNO$_3$ solution). A titanium tungsten layer 44 is then formed on silicon dioxide layer 42 using a well known sputtering process. Titanium tungsten layer 44 is typically 600 Å thick and is 90% tungsten, 10% titanium by mole, and as described in greater detail below, titanium tungsten layer 44 serves as the actual fuse material. Titanium tungsten layer 44 electrically contacts the platinum silicide at window regions 43, and therefore is electrically connected to the semiconductor devices formed thereunder in substrate 40.

A metal layer 46 is then formed on titanium tungsten layer 44. Layer 46 is typically aluminum or an alloy of aluminum and is sputtered onto titanium tungsten layer 44 to a thickness of about 6500 Å. A photolithographic mask 48 is then formed on metal layer 46 in a conventional manner.

Photolithographic mask 48 is patterned and therefore exposes portions of metal layer 46. The exposed portions of metal layer 46 and the portions of titanium tungsten layer 44 lying thereunder are then removed using a dry etching process. In one embodiment, metal layer 46 and titanium tungsten layer 44 are etched using a plasma etching process. In other embodiments, layers 44 and 46 are etched with a reactive ion etching process. Insulation layer 42 serves as an etch stop during this process. After this etching step, photolithographic mask 48 is removed. The resulting structure is illustrated in plan view in FIG. 2e.

Figure 2E:
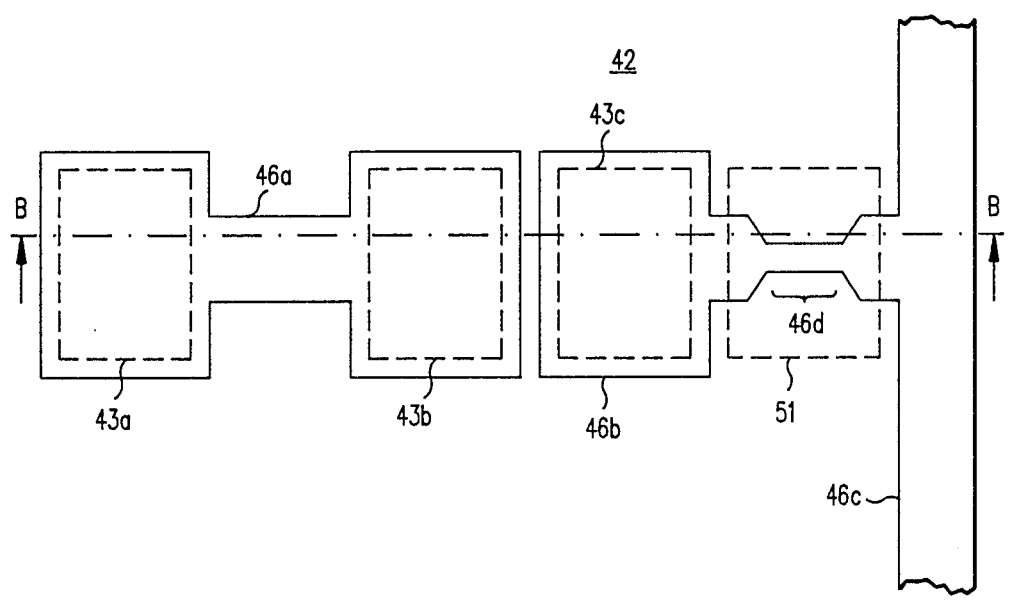
FIGS. 2a to 2e illustrate a fuse during a manufacturing process in accordance with the present invention.
Figure 2A:
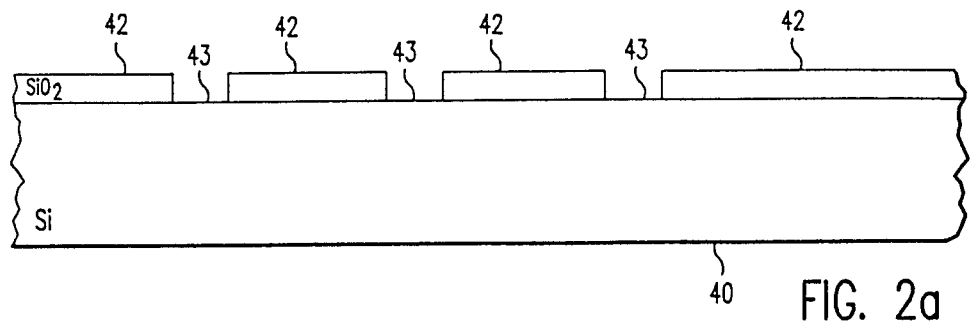
Figure 2B:
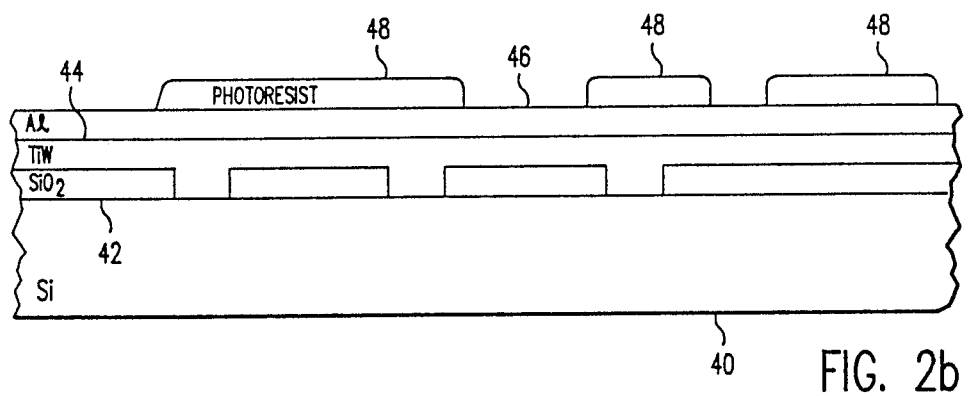
Figure 2C:
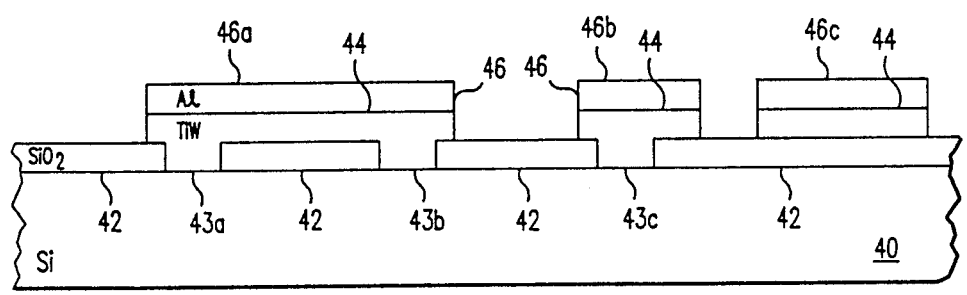
Figure 2D:
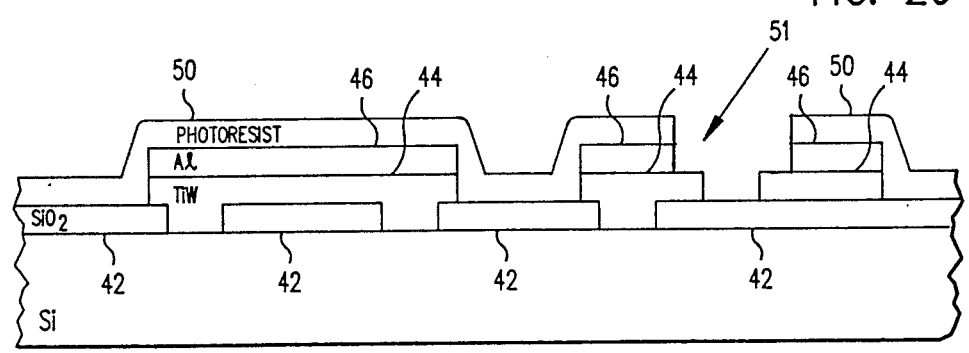

Referring to FIGS. 2c and 2e, a first portion 46a of metal layer 46 electrically interconnects the semiconductor material at window regions 43a and 43b, and therefore serves as a conductive interconnect. In addition, a second portion 46b of metal layer 46 is separated from a third portion 46c of metal layer 46 by a narrow metal region 46d. (Portion 46b of metal layer 46 contacts the underlying semiconductor material via window region 43c, while portion 46c serves as an electrical interconnect to other portions of the integrated circuit.) It will be appreciated by those skilled in the art in light of the teachings of this specification that underneath patterned metal layer 46 of FIG. 2c is the identically patterned remaining portion of titanium tungsten layer 44. Referring to FIG. 2d a second photolithographic mask 50 is then applied to the wafer. Photolithographic mask 50 includes a window region 51 (illustrated in dotted line in FIG. 2e) which defines an area surrounding the to-be-formed titanium tungsten fuse. The portion of metal layer 46 within window region 51 is then removed using a wet etching process so that only a narrow portion of titanium tungsten layer 44 separates metal 46b from metal 46c. This is typically accomplished using a mixture of phosphoric, acetic, and nitric acids.

It is noted that photolithographic mask 50 is an oversized mask, i.e., mask 50 defines an area which surrounds the fuse, but the exact dimensions of window region 51 are not critical, as long as the portion of metal layer 46 above the fuse is removed.

The removal of the portion of metal layer 46 within window region 51 ensures that the cross section of conductive material is small enough so that a current of about 15 to 30 mA is sufficient to open the fuse. Thereafter, photoresist layer 50 is removed and the integrated circuit is completed in a conventional manner.

It will be appreciated that because metal layer 46 and titanium tungsten layer 44 are etched simultaneously using a dry etching process, the size of the resulting fuse and metal traces can be controlled more accurately than in the prior art process described above.

While the invention has been described with respect to specific embodiments, those skilled in the art will appreciate that changes can be made in form and detail without departing from the spirit and scope of the invention. For example, fuse material other than titanium tungsten e.g. polycrystalline silicon can be used.

In addition, instead of aluminum, other electrically conductive materials can be used. Accordingly, all such changes come within the scope of the present invention.

I claim:

1. A method for forming a fuse comprising the steps of:

forming a first layer of a first material on a substrate;
   forming a second layer of a second material on said first layer;
   patterning said first and second layers such that the resulting pattern in said first layer is substantially identical to the pattern in said second layer; and
   removing a portion of said second layer after said step of patterning said first and second layers, a portion of said first layer underneath said removed portion remaining after said step of removing said portion of said second layer, said portion of said first layer serving as said fuse and wherein the remaining portions of said first and second layers are electrically conductive.

2. The method of claim 1 wherein said first layer is titanium tungsten and said second layer is metal.

3. The method of claim 1 further comprising the step of forming a first mask over said second layer prior to said step of patterning said first and second layers, said step of patterning said first and second layers comprising a dry etching process, the pattern in said first mask being transferred to said first and second layers during said dry etching process.

4. The method of claim 3 further comprising the steps of:

removing said first mask after said step of patterning said first and second layers;
   forming a second mask over said first and second layers, a window region being formed in said second mask, a portion of said second layer being exposed through said window region; and
   removing said exposed portion of said second layer, thereby exposing a portion of said first layer, said exposed portion of said first layer serving as said fuse.

5. The method of claim 1 wherein an insulating layer is formed between said substrate and said first layer.

6. The method of claim 1 wherein said second layer comprises aluminum.

* * * * *

UNITED STATES PATENT AND TRADEMARK OFFICE
CERTIFICATE OF CORRECTION

PATENT NO. : 4,740,485
DATED : 04/26/88
INVENTOR(S) : Bradley A. Sharpe-Geisler

Figure 1B:
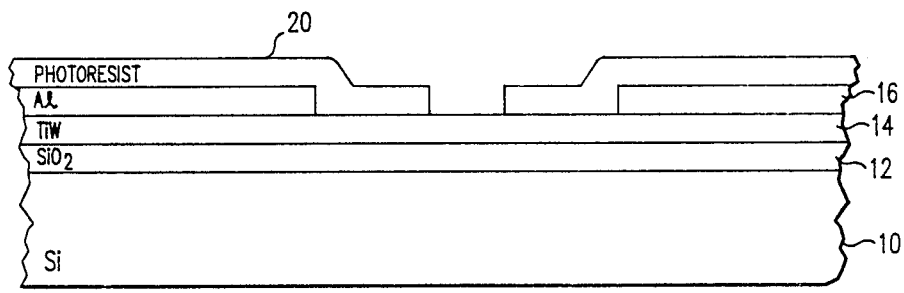
Figure 1C:
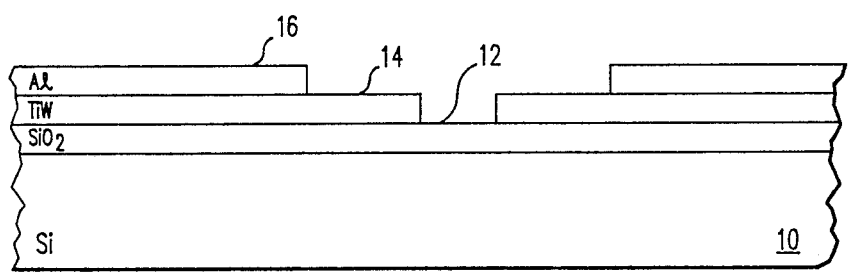
Figure 1D:
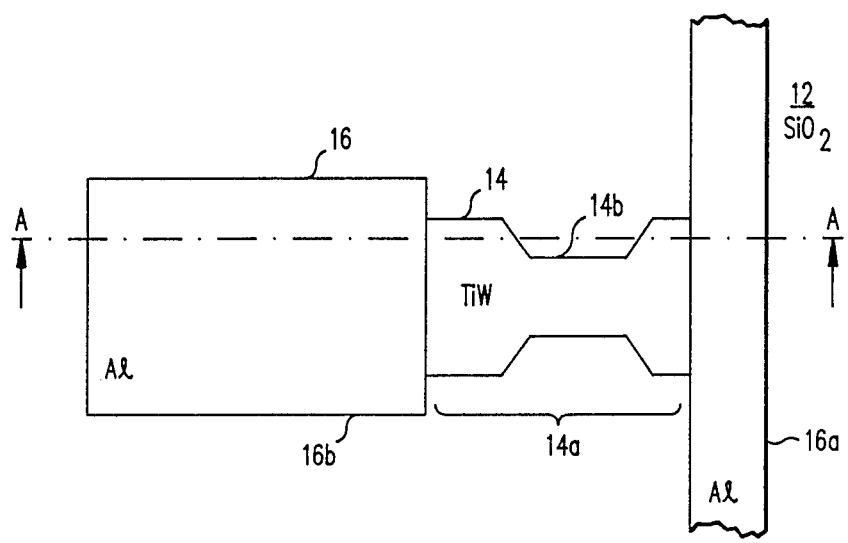

It is certified that error appears in the above-identified patent and that said Letters Patent is hereby corrected as shown below:

Abstract, line 3, "a aluminum" should read --an aluminum--.
Abstract, line 18, "to formed" should read --to be formed--.
Col. 1, line 53, add: --The cross section illustrated in Figure 1a to 1c is taken along line A-A to Figure 1d.--
Col. 3, line 36, add: --Figures 2a to 2d are cross section illustrations taken along lines B-B of the plan view illustrated in Figure 2e.--
Col. 4, line 63, "with the re-" should read --with re- --.
Col. 4, line 68, "tungsten" should read --tungsten,--.
Col. 4, line 68, "silicon" should read --silicon,--.

Signed and Sealed this

Eleventh Day of April, 1989

*Attest:*

DONALD J. QUIGG

*Attesting Officer*     *Commissioner of Patents and Trademarks*